United States Patent
Kim

(12) 
(10) Patent No.: US 6,576,376 B1
(45) Date of Patent: Jun. 10, 2003

(54) TRI-TONE MASK PROCESS FOR DENSE AND ISOLATED PATTERNS

(75) Inventor: Hung-Eil Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 137 days.

(21) Appl. No.: 09/778,586

(22) Filed: Feb. 7, 2001

(51) Int. Cl.[7] ................................................ G03F 9/00
(52) U.S. Cl. ......................................................... 430/5
(58) Field of Search ............................ 430/5, 322, 323, 430/324; 716/19, 20, 21

(56) References Cited

U.S. PATENT DOCUMENTS

| | | | | |
|---|---|---|---|---|
| 5,478,679 A | * | 12/1995 | Loong et al. | 430/5 |
| 5,591,550 A | * | 1/1997 | Choi et al. | 430/5 |
| 5,725,969 A | * | 3/1998 | Lee | 430/5 |
| 6,303,253 B1 | * | 10/2001 | Lu | 430/5 |
| 6,355,503 B2 | * | 3/2002 | Schroeder | 438/116 |

* cited by examiner

*Primary Examiner*—S. Rosasco
(74) *Attorney, Agent, or Firm*—Foley & Lardner

(57) ABSTRACT

An exemplary embodiment of the disclosure relates to a method of integrated circuit fabrication involving phase shifting materials. This method can include providing a layer of chrome; providing a layer of phase shifting material over the layer of chrome; providing open spaces in the layer of chrome and layer of phase shifting material according to a pattern; removing selected open spaces proximate other open spaces; and transferring the pattern of spaces to the integrated circuit wafer. The portion of the pattern removed by the removing step is transferred to the integrated circuit wafer by side lobe printing.

20 Claims, 3 Drawing Sheets

TRI-TONE MASK PROCESS FOR DENSE AND ISOLATED PATTERNS

FIELD OF THE INVENTION

The present specification relates generally to the field of integrated circuits and to methods of manufacturing integrated circuits. More particularly, the present specification relates to a tri-tone mask process for dense and isolated patterns.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

The ability to reduce the size of structures, such as, shorter IC gate lengths depends, in part, on the wavelength of light used to expose the photoresist. In conventional fabrication processes, optical devices expose the photoresist using light having a wavelength of 248 nm (nanometers), but conventional processes have also used the 193 nm wavelength. Further, next generation lithographic technologies may progress toward a radiation having a wavelength of 157 nm and even shorter wavelengths, such as those used in EUV lithography (e.g., 13 nm).

Phase-shifting mask technology has been used to improve the resolution and depth of focus of the photolithographic process. Phase-shifting mask technology refers to a photolithographic mask which selectively alters the phase of the light passing through certain areas of the mask in order to take advantage of destructive interference to improve resolution and depth of focus. For example, in a simple case, each aperture in the phase-shifting mask transmits light 180 degrees out of phase from light passing through adjacent apertures. This 180 degree phase difference causes any light overlapping from two adjacent apertures to interfere destructively, thereby reducing any exposure in the center "dark" comprising an opaque material, such as chrome.

An exemplary phase-shifting mask 10 is illustrated in FIG. 1. Phase-shifting mask 10 includes a transparent layer 12 and an opaque layer 14. Opaque layer 14 provides a printed circuit pattern to selectively block the transmission of light from transparent layer 12 to a layer of resist on a semiconductor wafer. Transparent layer 12 includes trenches 16 which are etched a predetermined depth into transparent layer 12. The light transmitted through transparent layer 12 at trenches 16 is phase-shifted 180 degrees from the transmission of light through other portions of phase-shifting mask, such as portions 18. As the light travels between phase-shifting mask 10 and the resist layer of a semiconductor wafer below (not shown), the light scattered from phase-shifting mask 10 at trenches 16 interferes destructively with the light transmitted through phase-shifting mask 10 at portions 18, to provide improved resolution and depth of focus.

As mentioned, various different wavelengths of light are used in different photolithographic processes. The optimal wavelength of light is based on many factors, such as the composition of the resist, the desired critical dimension (CD) of the integrated circuit, etc. Often, the optimal wavelength of light must be determined by performing a lithography test with photolithographic equipment having different wavelengths. When a phase-shifting mask technique is utilized, two different phase-shifting masks must be fabricated, each mask having trenches 16 suitable for phase-shifting light of the desired wavelength. The fabrication of phase-shifting masks is costly. Further, comparison of the effect of the two different wavelengths printing processes is difficult and requires complex software processing to provide a suitable display.

In conventional systems, application of a high transmittance attenuated phase-shifting mask (PSM) makes it difficult to improve the photomargin, or depth of focus, at dense and isolated pitches at the same time. For example, if a high coherence level (σ) or off-axis illumination is used, it is possible to obtain a large depth of focus at a dense pitch. A high coherence level can be at a pupil fill factor (PFF) of 0.2 or less. However, the depth of focus is small at isolated pitches using high coherence levels (σ). Pitch is commonly known as the distance between adjacent features or structures. Even using shorter lithographic wavelengths and various resolution enhancement techniques, the pitch is usually constrained to a dimension approximately equal to the lithographic wavelength. Furthermore, despite using optical proximity correction (OPC), the depth of focus for isolated pitches cannot be improved. If a low coherence level (σ) is used, a large depth of focus can be obtained at isolated pitches. However, the depth of focus is very small or virtually nothing at dense pitches using low σ. Furthermore, use of low coherence value (σ) also suffers from side lobe printing. The low coherence level (σ) can be at a pupil fill factor (PFF) of 0.80 or more.

Thus, there is a need for an improved phase-shifting mask. Further, there is a need for an improved depth of focus, or photo margin, at dense and isolated pitches in a phase shifting mask. Thus, there is a need to improve the photo process margin, or depth of focus, at dense pitches using sidelobe printing.

SUMMARY OF THE INVENTION

An exemplary embodiment relates to a method of integrated circuit fabrication involving phase shifting materials. This method can include providing a layer of chrome providing a layer of phase shifting material over the layer of chrome; providing open spaces in the layer of chrome and layer of phase shifting material according to a pattern; removing selected open spaces proximate other open spaces; and transferring the pattern of spaces to the integrated circuit wafer. The portion of the pattern removed by the removing step is transferred to the integrated circuit wafer by side lobe printing.

Another exemplary embodiment relates to a method of improving the photo margin at dense and isolated pitches at the same time in integrated circuit fabrication. This method can include providing a phase shifting mask including a phase shifting material and areas of densely patterned features; and removing selected patterned features in the areas of densely patterned features on the phase shifting mask.

Another exemplary embodiment relates to a method of improving the photo process margin using side lobe printing. This method can include patterning a mask; removing portions of the pattern by deleting open spaces in densely patterned areas of the pattern; and transferring the pattern from the mask to the integrated circuit wafer. Side lobe printing results in a transfer of removed portions of the pattern to the integrated circuit wafer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
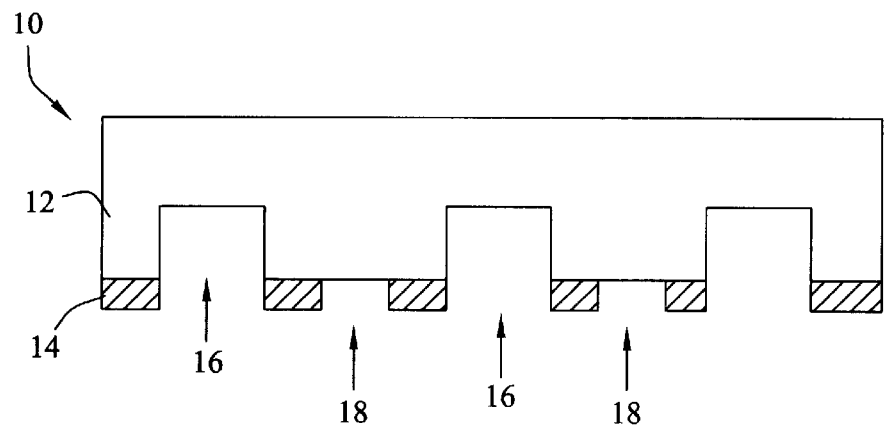
FIG. 1 is an exemplary phase-shifting mask used in conventional systems and processes.
Figure 2:
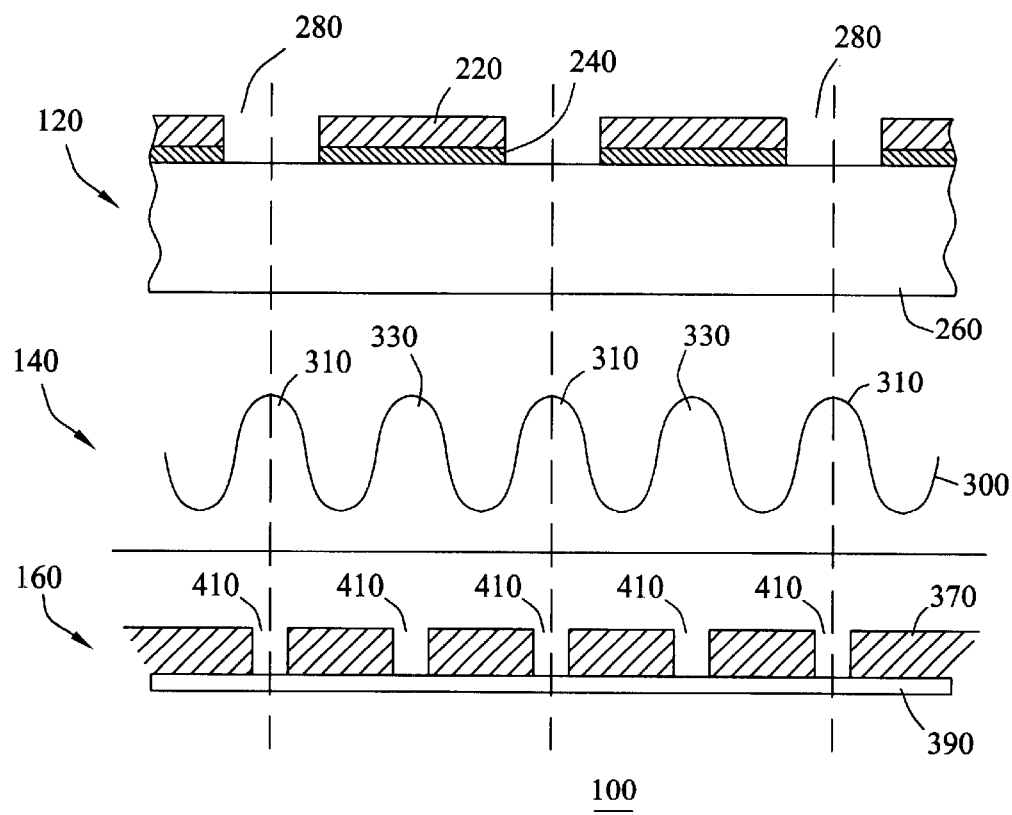
FIG. 2 is a graphical depiction of a cross-sectional view of a mask, a corresponding intensity pattern, and a patterned wafer according to an exemplary embodiment.

Referring to FIG. 2, a graphical depiction 100 illustrates a mask portion 120, an intensity pattern 140 corresponding to mask portion 120 during printing, and a wafer portion 160. Mask portion 120 includes an attenuated phase material layer 220, a chrome layer 240, a quartz layer 260, and trenches 280. Attenuated phase material layer 220 can be molybdenum silicon (MoSi) having an attenuation characteristic of between 20 and 40%. In alternative embodiments, other attenuation materials can be utilized for layer 220.

In an exemplary embodiment, chrome layer 240 is an opaque material and has a thickness of 1,000 Angstroms. Quartz layer 260 is a transparent material and has a thickness of 0.25 inches. Trenches 280 are apertures in attenuated phase material layer 220 and chrome layer 240. Trenches 280 are selectively located in mask portion 120 as to transfer a pattern to wafer portion 160. In an exemplary embodiment, trenches 280 are separated by a distance of 0.26 μm on 1×dimension from midpoint to midpoint (i.e., the pitch). The separation distance used is dependent on the design rule employed for a specific integrated circuit wafer design.

Intensity pattern 140 includes a waveform 300 having main lobes 310 and side lobes 330. Intensity pattern 140 represents the light or radiation intensity transferred from mask portion 120 to wafer portion 160 in a patterning process. Main lobes 310 correspond to higher light or radiation intensity passing through trenches 280 and quartz layer 260. Side lobes 330 correspond to higher intensity due to a combination of light or radiation from adjacent trenches 280 due to constructive interference.

Wafer portion 160 includes a photoresist layer 370 and a wafer substrate 390. Photoresist layer 370 can be a layer of any photoresist material and includes patterned features 410 transferred from mask portion 120. In an exemplary embodiment, there are more patterned features 410 than trenches 280 because of side lobe printing or the creation of side lobes 330 due to constructive interference from light or radiation passing through trenches 280 and quartz layer 260.

The term photo process margin as used herein refers to both depth of focus and exposure latitude. Depth of focus indicates the range of focus at which an original pattern is defined on a wafer with a defined critical dimension specification. Exposure latitude indicates the range of exposure dose at which an original pattern is defined on a wafer with a defined critical dimension specification.

Figure 3:
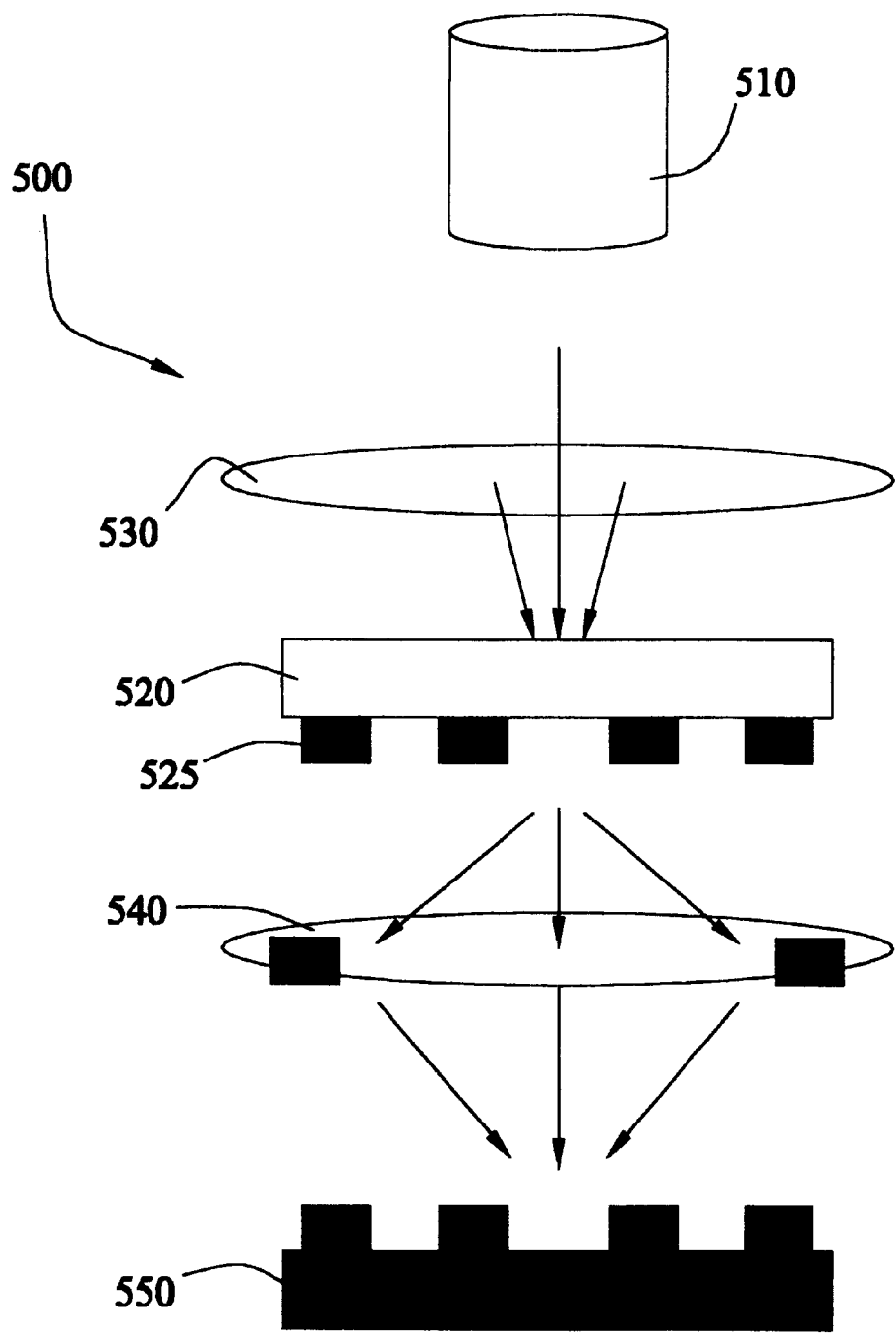
FIG. 3 is a schematic perspective view drawing of a lithographic system for processing a wafer according to another exemplary embodiment.

Referring to FIG. 3, an optical stepper or scanner 500 is illustrated which transfers a reticle image to a wafer 550 in the following manner. A laser or radiation beam from light source 510 is used to illuminate a reticle pattern on mask 520 having a reticle 525. The beam is diffracted at reticle 525 into a 0th order, +/−$1^{st}$ order, +/−$3^{rd}$ order, etc. A reduction lens 540 illuminates the diffraction beams to wafer 550. As such, there can be beam path differences on the wafer level, such as, between the +1$^{st}$ order and −1$^{st}$ order diffraction beams, due to imperfections in the lens or stepper system.

At best focus, path differences between each order of diffracted beams are not severe. Thus, images on the wafer are clear. Nevertheless, if there are wafer stage errors, such as, stage tilt and leveling error, some corners of the field of illumination are not at best focus. Therefore, there is a need to have a focus margin which allows for errors from the stepper system, wafer topology, etc. In an exemplary embodiment, a 0.6 μm depth of focus is needed for a 0.12 μm design rule. In an exemplary embodiment, a 20% exposure margin is desired.

Figure 4:
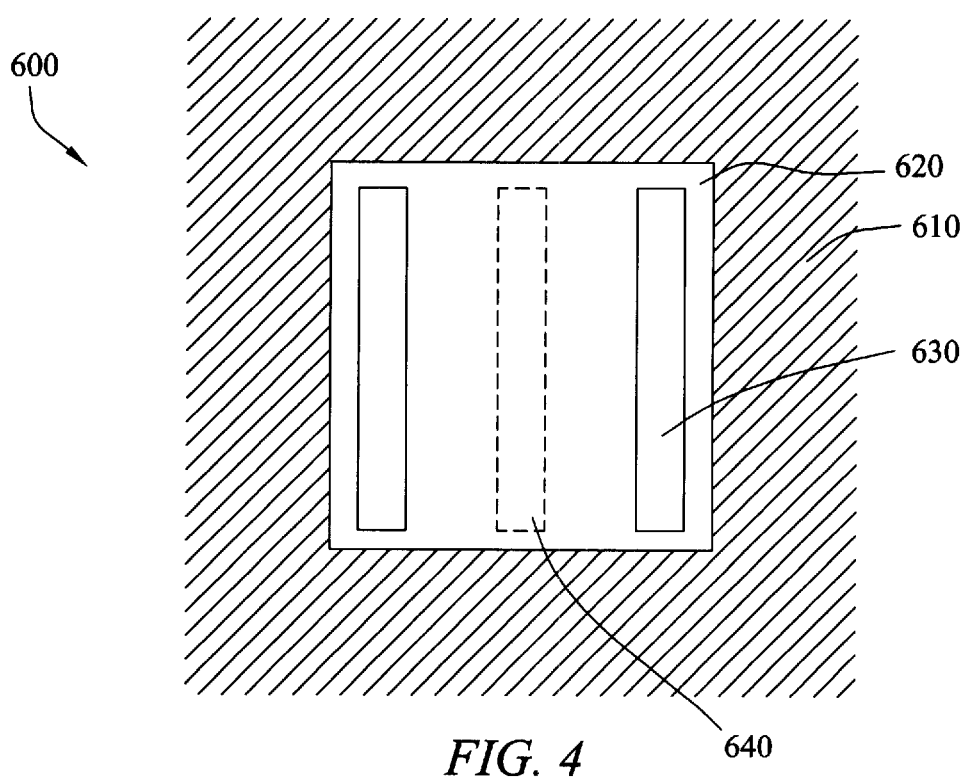
FIG. 4 is a top down view of a mask with an exemplary dense pattern according to yet another exemplary embodiment.

FIG. 4 illustrates a top view of a mask 600 including a chrome area 610, a phase shifter area 620, a patterned area 630, and a deleted patterned area 640. Phase shifter area 620 can be molybdenum silicon (MoSi) or any suitable phase-shifting material. Chrome area 610 can be any opaque material suitable for use in a phase-shifting mask. Patterned area 630 are apertures or trenches similar to trenches 280 described with reference to FIG. 2. Chrome area 610 and patterned area 630 can be obtained using commercial OPC software.

In an exemplary embodiment, patterned area 630 is a densely patterned area where features or patterns are located in close proximity to each other. In an exemplary embodiment, features are separated by a distance of 0.26 μm (as described with reference to trenches 280 in FIG. 2). The separation distance used is dependent on the design rule employed for a specific integrated circuit wafer design.

Deleted patterned area 640 is an area on mask 600 which is not needed to be patterned but is nevertheless transferred to a wafer due to side lobe printing, as described with reference to FIG. 2. Advantageously, the coherence level (σ) of laser or radiation used can be lower because the density of the pattern of mask 600 is less. Thus, making the pitch of patterned area 630 greater (and hence a less dense pattern) it is possible to use a low coherence level (σ) of light or radiation. The low coherence level (σ) can be at a pupil fill factor (PFF) of 0.3. Deleted patterned area 640 on mask 600 can be removed from the original design. The distance between removed selected areas is dependent on the design rule employed for a specific integrated circuit wafer design.

Figure 5:
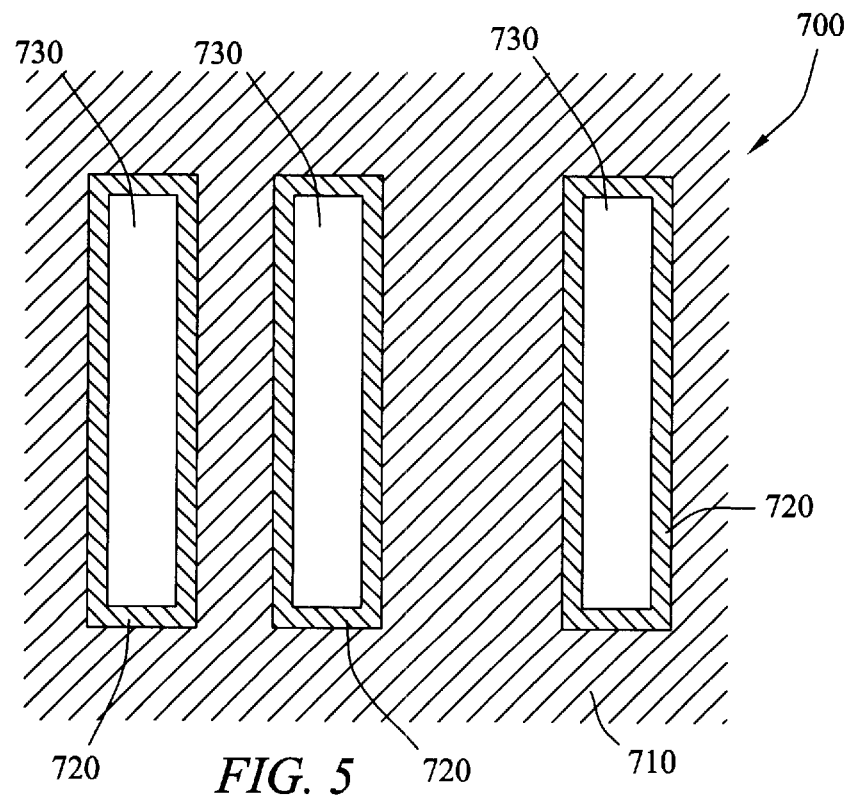
FIG. 5 is a top down view of a mask with an exemplary isolated pattern according to another exemplary embodiment.

FIG. 5 illustrates a mask 700 including a chrome area 710, phase shifting areas 720, and patterned areas 730. Patterned areas 730 are apertures or trenches, such as, trenches 280 (FIG. 2) and are separated by a distance considered non-dense or isolated. In an exemplary embodiment, the distance of separation between pattern areas 730 is 0.13 μm. Patterned areas 730 and chrome area 710 can be obtained using commercial OPC software.

Phase shifting areas 720 can be molybdenum silicon (MoSi) or any suitable phase shifting material. Chrome areas 710 are used to prevent side lobe creation with isolated patterns. Unlike mask 600, mask 700 does not need side lobes to transfer the pattern of dense features with a removed pattern because the pattern is not dense. Isolated patterns transfer well using a light or radiation with a low coherence level (σ). As such, chrome areas 710 are intended to minimize side lobe creation for the isolated and semi-isolated patterns.

Advantageously, mask 600 and mask 700 have improved photo margins (e.g., depth of focus) at dense pitches (mask 600) and isolated pitches (mask 700). Off-axis illumination of annular aperture and quadrapole aperture as well as higher coherence levels (σ) (e.g, greater than 0.7) are effective to improve the photo margin for dense pattern, such as, that shown in mask 600. Small coherence levels (σ) (e.g., less than 0.4) are effective to improve the photo margin for semi-dense (semi-isolated) and isolated patterns, such as, that shown in mask 700. As discussed with reference to FIGS. 1–5, it is possible to remove a pattern in an alternating fashion to make a dense pattern into a semi-dense pattern. Advantageously, the removed area is, nevertheless, patterned by the property of side lobe printing, if a small coherence level (σ) is used. As such, mask 600 (with an original dense pattern area) and mask 700 (with a semi-dense and isolated area) can improve the photo margin using a small coherence level (σ) (e.g., less than 0.4) at the same time.

While the embodiments illustrated in the FIGURES and described above are presently preferred, it should be understood that these embodiments are offered by way of example only. Other embodiments may include, for example, a variety of different pattern densities and configurations. The invention is not limited to a particular embodiment, but extends to various modifications, combinations, and permutations that nevertheless fall within the scope and spirit of the appended claims.

What is claimed is:

1. A method of integrated circuit fabrication involving phase shifting materials, the method comprising:

providing a first layer including chrome;

providing a layer of phase shifting material over the first layer;

providing open spaces in the first layer and layer of phase shifting material according to a pattern;

removing selected open spaces proximate other open spaces; and transferring the pattern of spaces to an integrated circuit wafer, the portion of the pattern removed by the removing step being transferred to the integrated circuit wafer by side lobe printing.

2. The method of claim 1, wherein the open spaces proximate other open spaces are separated by a distance of 0.26 μm pitch.

3. The method of claim 1, wherein the layer of phase shifting material has a transmittance of between 6% and 30%.

4. The method of claim 1, wherein the phase shifting material is molybdenum silicon (MoSi).

5. The method of claim 1, wherein the step of removing selected open spaces comprises identifying densely patterned areas.

6. The method of claim 5, wherein densely patterned areas are those with features separated by a distance of 0.26 μm pitch.

7. The method of claim 1, wherein the photo margin is improved by 50%.

8. A method of improving the photo margin at dense and isolated pitches at the same time in integrated circuit fabrication, the method comprising:

providing a phase shifting mask including a phase shifting material and areas of densely patterned features;

removing selected patterned features in the areas of densely patterned features on the phase shifting mask; and transferring the densely patterned features to an integrated circuit wafer, wherein the pattern features removed in the removing step are transferred to the integrated circuit by side lobe printing.

9. The method of claim 8, wherein the step of removing selected patterned features improves a common depth of focus at various pitches.

10. The method of claim 8, wherein the step of providing a phase shifting mask further comprises utilizing optical proximity correction software to obtain a pattern of integrated circuit features.

11. The method of claim 8, wherein the phase shifting material is molybdenum silicon (MoSi).

12. The method of claim 8, further comprising selecting patterned features separated by a distance from other patterned features optimized by a selected design rule.

13. The method of claim 8, wherein providing a phase shifting mask comprises depositing a chrome layer, depositing a phase shifting material over the chrome layer, and patterning features in areas of the chrome layer covered by the phase shifting material.

14. A method of improving the photo process margin using side lobe printing, the method comprising:

patterning a mask;

removing portions of the pattern by deleting open spaces in densely patterned areas of the pattern; and transferring the pattern from the mask to an integrated circuit wafer, wherein side lobe printing results in a transfer of removed portions of the pattern to the integrated circuit wafer.

15. The method of claim 14, wherein the step of removing portions of the pattern comprises identifying densely patterned areas, densely patterned areas having patterned features separated by a distance optimized by a selected design rule.

16. The method of claim 14, wherein the mask comprises a phase shifting material.

17. The method of claim 16, wherein the phase shifting material is molybdenum silicon (MoSi).

18. The method of claim 14, wherein the step of transferring the pattern results in a photo margin of 0.6 $\mu$m.

19. The method of claim 14, wherein the step of removing portions of the pattern comprises identifying densely patterned areas using a computer program.

20. The method of claim 14, wherein the step of patterning a mask over an integrated circuit wafer includes utilizing off-axis illumination.

* * * * *